April 29, 1958 G. A. NEFF 2,832,848
ELECTRICAL SIGNAL AMPLIFIERS
Filed Jan. 16, 1957
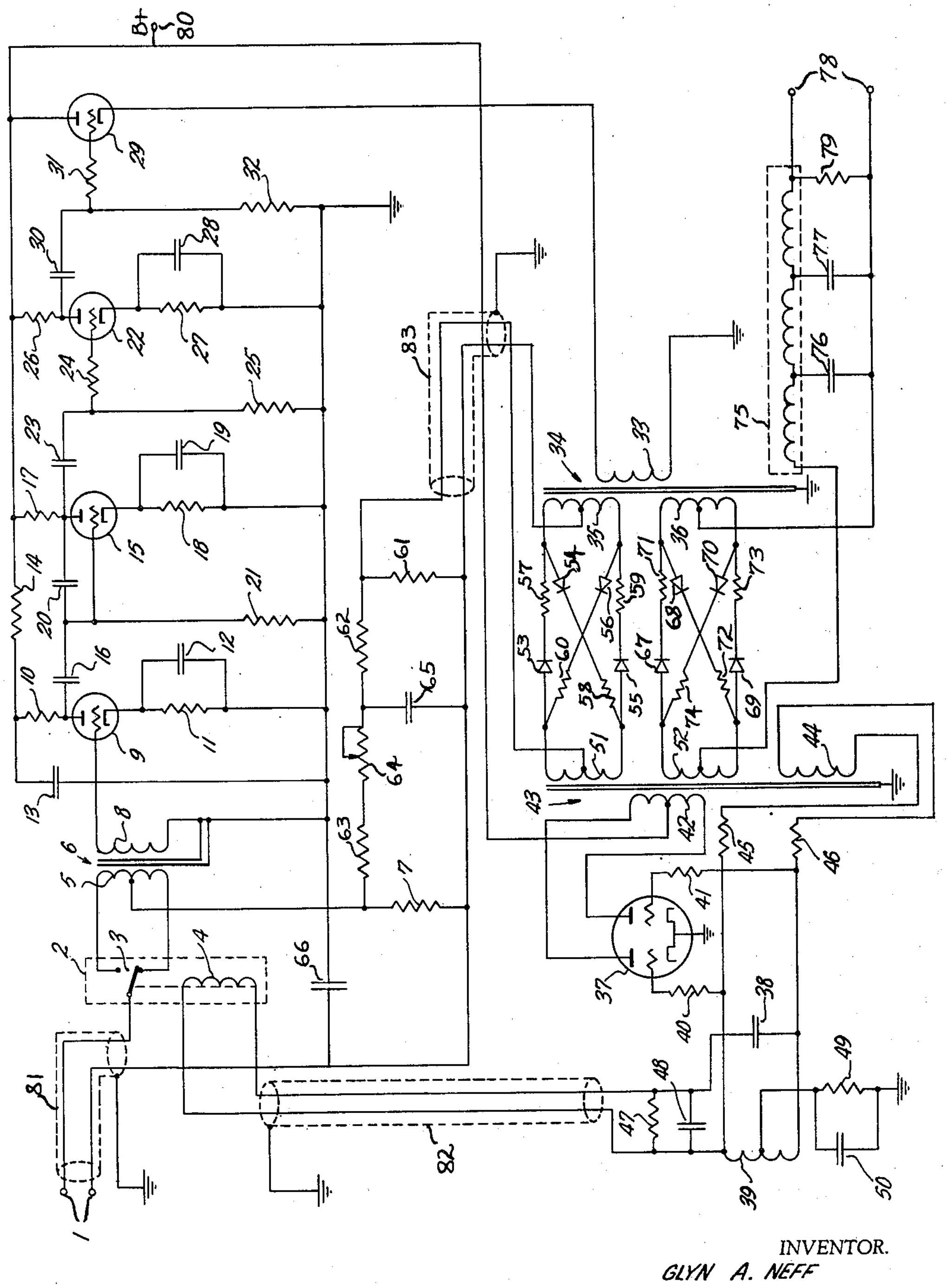
INVENTOR.
GLYN A. NEFF
BY Robert H. Fraser
ATTORNEY United States Patent Office 2,832,848 Patented Apr. 29, 1958

2,832,848

ELECTRICAL SIGNAL AMPLIFIERS

Glyn A. Neff, Pasadena, Calif.

Application January 16, 1957, Serial No. 634,569

11 Claims. (Cl. 179—171)

This application relates to electrical signal amplifiers and more particularly to an electrical signal amplifier in which low frequency and unidirectional electrical signals are amplified by means of a modulated alternating current carrier wave.

Electrical signal amplifiers are frequently employed to generate relatively strong output signals corresponding to relatively weak input signals. Often an electrical signal comprising an input signal includes low frequency and unidirectional (D. C.) components, e. g. a direct current component which fluctuates in accordance with a variable. Conventional electrical signal amplifiers generally are unsuitable for use in amplifying signals including low frequency and unidirectional components since they include coupling devices between stages which block the passage of signals below a lower frequency limit so that low frequency and unidirectional components are lost in the amplification process. One way in which signals having low frequency and unidirectional components may be amplified is by means of an amplifier which is direct coupled between stages. However, it is well known that the overall gain of a direct coupled amplifier tends to be unstable since the aging of the electron tubes and components affects the overall gain of the amplifier. An additional disadvantage of a direct coupled amplifier is that each succeeding amplification stage generally must be elevated in electrical potential because the direct coupling between amplification stages applies the operating voltage from each stage to the next successive stage.

In order to avoid the aforementioned difficulties, unidirectional and low frequency signals to be amplified may be converted to a modulated alternating current carrier wave which is amplified by an alternating current amplifier which need not be direct coupled between amplification stages. If an output signal having unidirectional and low frequency components is desired, the amplified modulated alternating current carrier wave may be reconverted to a signal corresponding to the input signal having low frequency and unidirectional components.

It is well known that the stability of an amplifier in which a low frequency or unidirectional signal is converted to a modulated alternating current carrier wave for amplification may be increased by including a negative feedback circuit which applies a portion of an output signal to an input circuit in a direction which tends to reduce the input signal. However, where a feedback circuit is connected between an output circuit and an input circuit the result is that the input circuit is electrically connected to the output circuit. Where the input circuits and output circuits are to be maintained at different biasing potentials or where the input circuits of several amplifiers sharing a common output circuit must be electrically separate, it is essential that no electrical connection be made via a feedback circuit between input and output circuits. Heretofore, to provide isolated input circuits and output circuits where a feedback circuit is required, it has been necessary to include a mechanical linkage. For example, a motor may be positioned in accordance with an output signal from an amplifier, and an electrical signal generating device, such as a potentiometer, may be linked to the motor and electrically connected in the feedback circuit. By means of the potentiometer, a feedback voltage is provided without electrically connecting the input circuit and the output circuit. Where the output circuit must be electrically separated from both the input circuit and the feedback circuit, it has been necessary to link an additional potentiometer to the motor which is positioned to generate an output signal.

In any system in which a mechanical linkage is included to isolate the input, output and feedback circuits, the elements of the mechanical linkage possess a certain amount of inertia which limits the capability of the system as a whole to respond to relatively fast variations in the input signal. Accordingly, an amplifier which includes a mechanical linkage is not suitable where rapidly varying signals must be amplified. Heretofore, there has been on satisfactory way to isolate the amplifier input circuits from the amplifier output circuits while at the same time preserving the amplifier's ability to amplify rapidly fluctuating input signals including low frequency and unidirectional components. Accordingly, it is one object of the invention to provide a new and improved amplifier in which the input circuit and output circuit are electrically isolated.

It is another object of the invention to provide an amplifier which is capable of responding to input signals which vary rapidly and in which the input circuit is electrically isolated from the output circuit.

It is an additional object of the invention to provide a new and improved amplifier having a feedback circuit.

It is still another object of the invention to provide a a new and improved amplifier in which low frequency and unidirectional feedback signals are derived from an alternating current signal.

In accordance with the invention, an amplifier is provided having electrically separate input and output circuits in which an input signal is converted to a modulated alternating current carrier wave, the modulated alternating current carrier wave is amplified, a feedback signal including low frequency and unidirectional components is derived from the amplified modulated alternating current carrier wave, and an output signal is derived by a means separate from the means for deriving the feedback signal.

A better understanding of the invention may be had from the following detailed description taken in conjunction with the drawing, in which the single figure is a schematic circuit diagram of an amplifier including an illustrative embodiment of the invention.

In the amplifier of the drawing, an input signal including unidirectional (D. C.) components of either polarity may be applied to a pair of terminals 1. An input circuit to which the terminals 1 are connected includes a converter or modulator in the form of a vibrator-type circuit interrupter 2 which includes a set of single-pole double-throw switch contacts 3 and an actuating coil 4. When the actuating coil 4 is energized with alternating current, the switch contacts 3 open and close to connect one of the input terminals 1 alternately to opposite ends of a primary winding 5 of a transformer 6. A center tap on the primary winding 5 is returned to the other of the input terminals 1 via a resistor 7, across which appears a feedback signal which is described in detail below.

Due to the application of the input signal alternately to opposite ends of the primary winding 5, an alternating current signal appears across the primary winding 5 which is coupled to a secondary winding 8 of the transformer 6 in the form of a carrier wave which is amplitude modulated in accordance with the signal applied to the terminals 1. In addition, the alternating current signal appearing across the secondary winding 8 bears a phase relationship to the alternating current wave applied to the actuating coil 4 which corresponds to the polarity of the input signal. That is, for a positive input signal the alternating current signal is of one phase, and for a negative input signal the alternating current signal is of opposite phase.

The alternating current signal from the secondary winding 8 is applied to the control electrode of an amplifier electron tube 9. Operating voltage is applied to the anode of the electron tube 9 via a load resistor 10. A conventional cathode resistor 11 and a by-pass capacitor 12 are connected in parallel to the cathode of the electron tube 9. A decoupling capacitor 13 maintains the end of the load resistor 10 away from the electron tube 9 at substantially ground potential for alternating currents and a resistor 14 is connected serially with the load resistor 10 to isolate the amplifier tube 9 from the remainder of the circuit.

At the anode of the electron tube 9 an alternating current signal appears which is passed to the control electrode of a second amplifier electron tube 15 via a coupling capacitor 16. A conventional load resistor 17 is connected to the anode of the electron tube 15 and a cathode resistor 18 and by-pass capacitor 19 are connected to the cathode of the electron tube 15. In addition, a capacitor 20 is connected between the anode and control electrode of the electron tube 15 to stabilize the amplifier circuit and eliminate oscillations. A conventional grid leak resistor 21 is connected between the control electrode of the electron tube 15 and ground reference potential.

The alternating current signal appearing at the anode of the electron tube 15 is applied to the control electrode of a third amplifier electron tube 22 via a coupling capacitor 23 and a grid current limiting resistor 24. A conventional grid leak resistor 25 returns the control electrode to ground reference potential, a load resistor 26 is connected to the anode, and a cathode resistor 27 and by-pass capacitor 28 are connected in parallel to the cathode of the electron tube 22.

The alternating current signal appearing at the anode of the electron tube 22 is passed to the control electrode of a cathode follower electron tube 29 via a coupling capacitor 30 and a grid current limiting resistor 31. The control electrode of the cathode follower electron tube 29 is returned to ground reference potential via the resistor 31 and a grid leak resistor 32.

In a conventional manner, operating voltage is applied directly to the anode of the cathode follower electron tube 29, and a primary winding 33 of an output transformer 34 is connected serially with the cathode of the electron tube 29. The circuit of the cathode follower electron tube 29 functions as an impedance changing device to couple the amplifier of the electron tubes 9, 15, and 22 to the load presented by the transformer 34.

The output transformer 34 includes two separate secondary windings 35 and 36, across each of which appears an alternating current signal. Connected to each of the secondary windings 35 and 36 is a separate synchronous demodulator which is adapted to compare alternating currents of the same frequency and provide an output signal as a result of the comparison. The synchronous demodulators are described in detail below.

An alternating current wave which is employed as a reference wave may be generated by means of an oscillator which includes a double-triode electron tube 37. A frequency determining tank circuit is included in the oscillator comprising a capacitor 38 and an inductance which is provided in part by a coil 39 and in part by the inductance of the coil 4 of the converter 2. In operation, the capacitor 38 and the coils 4 and 39 have a predetermined resonant frequency which may be for example, 400 cycles per second.

Each end of the coil 39 is connected to a control electrode of the double-triode electron tube 37 via the resistors 40 and 41. In operation, the sections of the electron tube 37 are alternately rendered conducting and the resistors 40 and 41 limit the grid current flow in such a way as to generate a substantially square switching wave between the anodes of the electron tube 37. The square switching wave is applied across a center tapped primary winding 42 of a transformer 43. A feedback circuit for the oscillatoor is provided by means of a secondary winding 44 of the transformer 43 which is connected to the tank circuit coil 39 via a pair of isolation resistors 45 and 46. In practice it has been found that there is a tendency for parasitic oscillation to occur in the converter coil 4. For this reason a damping resistor 47 and capacitor 48 are connected across the coil 4. In order to provide biasing for the electron tube 37 and a return circuit from the cathode of the electron tube 37 to the tank circuit, a resistor 49 and a by-pass capacitor 50 are connected in parallel between a center tap on the coil 39 and ground reference potential.

The alternating current switching wave appearing across the primary winding 42 is induced in a pair of secondary windings 51 and 52 of the transformer 43.

The reference wave generated by the oscillator is used for the purpose of driving the actuating coil 4 of the converter 2. In addition, an alternating current wave from the oscillator is applied to the synchronous demodulators in which the amplified alternating current signal is compared with the reference wave. Thus, by means of the oscillator the reference wave applied to the synchronous demodulators bears a fixed phase relationship to the opening and closing of the contacts 3 and also bears a fixed phase relationship to the alternating current signal.

A feedback circuit synchronous demodulator includes a secondary winding 51 of the transformer 43 and a secondary winding 35 of the transformer 34. Connected between the secondary windings 35 and 51 is a ring-type demodulator which includes four diodes 53, 54, 55, and 56. Each of the diodes 53–56 has a resistor 57, 58, 59, 60 connected serially therewith for the purpose of minimizing the effect of any dissimilarities in the characteristics of the diodes 53–56 and to limit the maximum current flow therethrough. In operation, when the reference wave introduced across the secondary winding 51 is of the same phase as the alternating current signal appearing across the winding 35, a signal corresponding to the input signal including low frequency components and a unidirectional component of a given polarity appears between the center tap connections on the secondary windings 35 and 51. In contrast, when the reference wave appearing across the winding 51 is of opposite phase to the alternating current signal appearing across the winding 35, a signal corresponding to the input signal appears between the center tap connections to the secondary windings 35 and 51 having a unidirectional component which is of opposite polarity to the aforementioned given polarity. The magnitude of the unidirectional component is a function of the relative amplitudes of the reference wave and the alternating current signal. Since the reference wave is of a much larger amplitude than the alternating current signal, the unidirectional component has a magnitude which varies in accordance with the amplitude of the alternating current signal. Thus, a signal is generated by the feedback circuit synchronous demodulator which has a polarity corresponding to the phase of the alternating current signal and a magnitude corresponding to the amplitude of the alternating current signal. Since the phase and amplitude of the alternating current signal correspond to the input signal as described above, the signal provided by the feedback circuit synchronous demodulator represents an amplified version of the input signal including both low frequency and unidirectional components as well as any upper frequency components appearing therein.

The signal derived from the center tap connections on the secondary windings 35 and 51 appears across a resistor 61. The signal appearing across the resistor 61 is applied to a voltage divider comprising the fixed resistors 62, 63, and 7 and an adjustable resistor 64. A by-pass capacitor 65 functions to filter the unwanted alternating current demodulation products from the feedback signal so that a low frequency and unidirectional freedback signal appears across the resistor 7. By varying the adjustable resistor 64 the amount of feedback can be controlled which functions to vary the overall gain of the amplifier.

The feedback circuit is a negative or inverse feedback arrangement in which the signal appearing across the resistor 7 opposes the input signal applied to the terminals 1. A capacitor 66 returns one side of the input circuit to ground reference potential for alternating current. Where the input transformer 6 includes appropriate shielding between the primary winding 5 and the secondary winding 8, the capacitor 6 may be omitted so that the input circuit it truly floating for all frequencies of input signals applied thereto. Since the transformers 34 and 43 are adapted to pass only alternating current the feedback circuit synchronous demodulator floats with the input circuit and is conductively isolated from the remainder of the circuit and from ground reference potential.

In a similar fashion, an output signal including unidirectional and low frequency components may be derived from an output circuit synchronous demodulator which includes the secondary winding 52 of the transformer 43 and the secondary winding 36 of the transformer 34. The output circuit synchronous demodulator includes four diodes 67, 68, 69, and 70 which are each connected serially with a resistor 71, 72, 73, 74 for the purpose of minimizing the effect of any dissimilarities in the diodes 67–70 and limiting the current flow therethrough.

Across the center tap connections to the secondary windings 36 and 52 appears a signal corresponding to the relative phases and amplitudes of the reference wave appearing across the winding 52 and the alternating current signal appearing across the winding 36. The signal appearing between the center tap connections to the windings 36 and 52 is applied to a filter circuit which includes an inductance 75 having three separate sections and the filter capacitors 76 and 77. The inductance 75 and filter capacitors 76 and 77 effectively remove substantially all alternating current signal components of the frequency of the reference wave and higher from the signal so that a signal appears at the output terminals 78 corresponding to an amplified version of the input signal. A resistor 79 is connected across the terminals 78 to terminate the filter in a proper impedance.

The following list of electron tube types and component values is given by way of example, being indicative only of one workable embodiment:

| | |
|---|---|
| Electron tubes 9, 15, 22, 29 | Triode section of tube type 12AY7. |
| Electron tube 37 | Tube type 5687. |
| Resistor 7 | 310 ohms. |
| Resistors 10, 17, 26 | 100,000 ohms. |
| Resistors 11,18, 27, 45, 46 | 1,000 ohms. |
| Resistors 14, 24, 31 | 47,000 ohms. |
| Resistors 21, 25, 32 | 470,000 ohms. |
| Resistors 40, 41 | 6,800 ohms. |
| Resistor 47 | 22 ohms. |
| Resistor 49 | 22,000 ohms. |
| Resistors 57, 58, 59, 60, 71, 72, 73, 74 | 300 ohms. |
| Resistors 61, 79 | 100 ohms. |
| Resistors 62, 63 | 15,000 ohms. |
| Resistor 64 | 10,000 ohms. |
| Capacitors 12, 19, 28 | 100 microfarads. |
| Capacitor 20 | 100 micromicrofarads. |
| Capacitor 13 | 10 microfarads. |
| Capacitors 16, 23, 30 | .1 microfarad. |
| Capacitors 38, 65, 66 | 1 microfarad. |
| Capacitor 48 | .022 microfarad. |
| Capacitor 50 | 25 microfarads. |
| Capacitors 76, 77 | 18 microfarads. |
| Coil 39 | 150 millihenries. |
| Inductance 75 | 3 sections; 90 millihenries, 180 millihenries and 90 millihenries. |

The connections made to the core symbols in the drawing for each of the transformers 6, 34 and 43 indicate that the transformers are of the type which include an electrostatic shield for reducing capacitive coupling between the windings whereby energy is transferred by the inductive action of the transformers only.

The dashed enclosures 81, 82, and 83 surrounding the connections to the input terminals 1, the connections to the converter coil 4 and the connections between the feedback circuit synchronous demodulator and the resistor 61 indicate that in a preferred embodiment, shielded cables should be used with the shields being connected to ground reference potential.

It will be appreciated that a conventional heater winding is included in each of the several electron tubes 9, 15, 22, 29 and 37 for elevating the cathodes to electron emissive temperature although the actual heater symbols and connections have been omitted to simplify the drawing. Suitable voltages for energizing the heaters along with a positive operating potential may be derived from any conventional power supply (not shown). The positive operating potential may be applied to the anodes of all the electron tubes between a terminal 80 and ground reference potential.

In accordance with the invention, the exemplary embodiment includes an amplifier in which a unidirectional input signal is converted to an alternating current signal for amplification, the feedback circuit supplies a feedback signal corresponding to the input signal to the input circuit without affecting the electrical isolation of the input circuit from the remainder of the amplifier, and the output circuit is conductively isolated from the input circuit and the remainder of the amplifier. The output circuit may be arranged by means of a synchronous demodulator to provide an output signal having unidirectional and low frequency components as well as upper frequency components appearing in the input signal.

Although a specific demodulator circuit has been shown, it will be appreciated that other types of comparison circuits may be employed. Accordingly, the words "synchronous demodulator" as used herein, are intended to have general meaning and to cover any form of comparison circuit which is adapted to provide a signal or voltage representing a comparison between an alternating current signal and a reference wave.

Although an exemplary embodiment of the invention has been illustrated and specific circuit component values have been given, the invention is not limited thereto. Accordingly, the accompanying claims are intended to include all equivalent arrangements falling within the scope of the invention.

What is claimed is:

1. Apparatus including the combination of an input circuit for receiving an input signal, means connected to the input circuit for generating an alternating current wave modulated in accordance with the input signal, an amplifier coupled to the generating means to receive said alternating current wave, a negative feedback circuit connected to the input circuit, said feedback circuit including a demodulator coupled to the amplifier to derive a negative feedback voltage from an amplified alternating current wave from the amplifier, an output circuit coupled to the amplifier, and means for conductively isolating the output circuit from the input and feedback circuits.

2. Apparatus for amplifying an input signal having a unidirectional component including in combination a converter for generating an alternating current signal representing the input signal, an alternating current signal amplifier coupled to the converter, a pair of synchronous demodulators each of which is adpated to generate a voltage representing a comparison between an alternating current signal and an alternating current reference wave, each of said synchronous demodulators being conductively isolated from the other, means applying an alternating current reference wave to both of said synchronous demodulators, means coupling the alternating current signal amplifier to both of the synchronous demodulators, means deriving a negative feedback voltage from one of the synchronous demodulators, and means deriving an output voltage from the other of the synchronous demodulators.

3. In an amplifier in which an input circuit is electrically separated from an output circuit, the combination of an input circuit for receiving an input signal, said input circuit including a converter for generating an alternating current signal modulated in accordance with the input signal, an alternating current signal amplifier, means coupling the converter to the alternating current signal amplifier for the passage of alternating current signals only, a feedback circuit demodulator, means coupling the alternating current signal amplifier to the feedback circuit demodulator for the passage of alternating current signals only, means connected between the feedback circuit demodulator and input circuit for opposing a feedback voltage derived from the feedback circuit demodulator to the input signal in the input circuit, an output circuit demodulator conductively isolated from the feedback circuit demodulator and the input circuit, means coupling the alternating current signal amplifier to the output circuit demodulator for the passage of alternating current signals only, and means driving the feedback and output circuit demodulators and the converter synchronously whereby both the feedback voltage and the output voltage include any low frequency or unidirectional components appearing in the input signal.

4. In an amplifier of the type in which input signals are converted to alternating current signals of predetermined frequency for amplification, the combination of an input circuit, a converter coupled to the input circuit for generating alternating current signals having a predetermined frequency of reversible phase and variable amplitude corresponding to the polarity and magnitude of signals applied to the input circuit, an alternating current signal amplifier coupled to the converter to receive alternating current signals only, a negative feedback circuit coupled between the alternating current signal amplifier and the input circuit, said feedback circuit including a synchronous demodulator which is coupled to the alternating current signal amplifier to receive alternating current signals only, an output circuit coupled to the alternating current signal amplifier, means for conductively isolating the output circuit from the input and feedback circuits, said output circuit including a synchronous demodulator which is coupled to the alternating current signal amplifier to receive alternating current signals only, and a source of alternating current waves of said predetermined frequency coupled to the feedback and output circuit synchronous demodulators.

5. In an amplifier of the type in which an input signal is converted to an alternating current signal for amplification, the combination of an input circuit for receiving input signals, a converter connected to the input circuit for generating alternating current signals of predetermined frequency having a reversible phase and variable amplitude corresponding to the polarity and magnitude of the input signal, an alternating current signal amplifier coupled to the converter to receive alternating current signals only, a negative feedback circuit coupled between the alternating current signal amplifier and the input circuit, said feedback circuit including a synchronous demodulator which is coupled to the alternating current signal amplifier to receive alternating current signals only, an output circuit conductively separate from the feedback circuit demodulator and the input circuit, said output circuit including a synchronous demodulator which is coupled to the alternating current signal amplifier to receive alternating current signals only, and a source of alternating current waves of said predetermined frequency coupled to said converter, said feedback circuit synchronous demodulator, and said output circuit synchronous demodulator.

6. An amplifier including the combination of an input circuit for receiving a signal having unidirectional and low frequency components, a converter coupled to the input circuit for providing an alternating current signal modulated in accordance with a signal applied to the input circuit, an amplifier coupled to the converter to receive alternating current signals, a feedback circuit demodulator coupled between the amplifier and the input circuit for deriving a negative feedback voltage from an amplified alternating current signal from the amplifier, an output circuit coupled to the amplifier, means for conductively isolating the output circuit from the input circuit and the feedback circuit demodulator and means driving the feedback circuit demodulator and the converter synchronously whereby the feedback voltage includes unidirectional and low frequency components corresponding to an input signal applied to the input circuit.

7. Apparatus in accordance with claim 6 in which the output circuit includes means for deriving an output signal including unidirectional and low frequency components corresponding to an input signal applied to the input circuit.

8. Apparatus for amplifying an input signal, including the combination of an input transformer having at least one primary winding and at least one secondary winding, an input circuit including a converter coupled to the primary winding for generating an alternating current signal modulated in accordance with an input signal applied to the input circuit, an amplifier coupled to the secondary winding, an output transformer having at least one primary winding and at least one secondary winding, said output transformer primary winding being connected to said amplifier, a feedback circuit demodulator connected between the output transformer secondary winding and the input circuit, an output circuit coupled to the amplifier, and means for conductively isolating the output circuit from the input circuit and the feedback circuit demodulator.

9. Apparatus in accordance with claim 8 including means for driving the converter and the feedback circuit demodulator synchronously.

10. Apparatus in accordance with claim 8 including an output circuit demodulator coupled to a secondary winding of the output transformer conductively isolated from the secondary winding of the output transformer to which the feedback circuit demodulator is connected.

11. Apparatus in accordance with claim 10 including means for driving the converter, the feedback circuit demodulator and the output circuit demodulator synchronously.

References Cited in the file of this patent

UNITED STATES PATENTS

| | | |
|---|---|---|
| 2,297,543 | Eberhardt et al. | Sept. 29, 1942 |
| 2,719,191 | Hermes | Sept. 27, 1955 |
| 2,773,137 | Hollmann | Dec. 4, 1956 |
| 2,795,648 | Mason | June 11, 1957 |

FOREIGN PATENTS

| | | |
|---|---|---|
| 115,412 | Australia | July 9, 1942 |
| 857,402 | Germany | Nov. 27, 1952 |

UNITED STATES PATENT OFFICE

CERTIFICATE OF CORRECTION

Patent No. 2,832,848 April 29, 1958

Glyn A. Neff

It is hereby certified that error appears in the printed specification of the above numbered patent requiring correction and that the said Letters Patent should read as corrected below.

Column 2, line 21, for "been on" read -- been no --; line 36, before "new and" strike out "a"; column 4, line 9, for "oscillatoor" read -- oscillator --; column 5, line 20, for "it truly" read -- is truly --; column 7, line 4, for "adpated" read -- adapted --.

Signed and sealed this 24th day of February 1959.

(SEAL)

Attest:

KARL H. AXLINE

Attesting Officer

ROBERT C. WATSON

Commissioner of Patents